United States Patent
Li (10) Patent No.: US 9,472,578 B2
(45) Date of Patent: Oct. 18, 2016

(54) DISPLAY SUBSTRATE AND FABRICATING METHOD THEREOF, DISPLAY PANEL, AND DISPLAY DEVICE

(71) Applicant: BOE TECHNOLOGY GROUP CO., LTD., Beijing (CN)

(72) Inventor: Yunfei Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/421,536

(22) PCT Filed: May 27, 2014

(86) PCT No.: PCT/CN2014/078532
§ 371 (c)(1),
(2) Date: Feb. 13, 2015

(87) PCT Pub. No.: WO2015/055011
PCT Pub. Date: Apr. 23, 2015

(65) Prior Publication Data
US 2016/0035745 A1 Feb. 4, 2016

(30) Foreign Application Priority Data

Oct. 17, 2013 (CN) .......................... 2013 1 0488490

(51) Int. Cl.
*H01L 27/12* (2006.01)
*H01L 27/32* (2006.01)

(52) U.S. Cl.
CPC ......... *H01L 27/124* (2013.01); *H01L 27/1259* (2013.01); *H01L 27/3248* (2013.01)

(58) Field of Classification Search
CPC . G02F 1/136227; G02F 1/1362; H01L 29/04
USPC .......................................... 257/72; 438/151
See application file for complete search history.

(56) References Cited

U.S. PATENT DOCUMENTS

2002/0057396 A1* 5/2002 Tsubo ................... G02F 1/1362
349/43
2006/0289866 A1* 12/2006 Araki ................ G02F 1/136227
257/59

FOREIGN PATENT DOCUMENTS

CN       1885549 A     12/2006
CN       1904703 A     1/2007
(Continued)

OTHER PUBLICATIONS

First Office Action dated Jun. 23, 2014 corresponding to application No. 201310488490.X.
(Continued)

*Primary Examiner* — Cuong Q Nguyen
*Assistant Examiner* — Tong-Ho Kim
(74) *Attorney, Agent, or Firm* — Nath, Goldberg & Meyer; Joshua B. Goldberg; Leonid D. Thenor (57) ABSTRACT

The present invention provides a display substrate and a fabricating method thereof, a display panel, and a display device. The display substrate comprises a base substrate, gate lines and data lines formed on the base substrate, and at least one pixel unit defined by the gate lines and the date lines, wherein each pixel unit comprises a thin film transistor and a pixel electrode, and in each pixel unit, a drain electrode of the thin film transistor is electrically connected with the pixel electrode by at least part of an edge region of at least one side of the drain electrode. The technical solution of the present invention can increase the number of contact points and/or contact area for connecting the pixel electrode and the drain electrode, and thus display quality is improved.

7 Claims, 4 Drawing Sheets

(56) References Cited

FOREIGN PATENT DOCUMENTS

| | | | |
|---|---|---|---|
| CN | 1987622 A | 6/2007 |
| CN | 101326560 A | 12/2008 |
| CN | 101424794 A | 5/2009 |
| CN | 101442058 A | 5/2009 |
| CN | 102983135 A | 3/2013 |
| CN | 202940240 U | 5/2013 |
| CN | 103531096 A | 1/2014 |
| CN | 203644316 U | 6/2014 |
| JP | 2004070196 A | 3/2004 |

OTHER PUBLICATIONS

Second Office Action dated Dec. 31, 2014 corresponding to application No. 201310488490.X.

International Application No. PCT/CN2014/078532, International Search Report dated Sep. 2, 2014, fourteen (14) pages.

\* cited by examiner

DISPLAY SUBSTRATE AND FABRICATING METHOD THEREOF, DISPLAY PANEL, AND DISPLAY DEVICE

This is a National Phase Application filed under 35 U.S.C. 371 as a national stage of PCT/CN2014/078532, filed May 27, 2014, and claims priority benefit from Chinese Application No. 201310488490.X, filed Oct. 17, 2013, the content of each of which is hereby incorporated by reference in its entirety.

FIELD OF THE INVENTION

The present invention relates to the field of display technology, and particularly to a display substrate and a fabricating method thereof, a display panel and a display device.

BACKGROUND OF THE INVENTION

Flexible display has been more and more widely used in our lives due to its characteristics of light weight, thin thickness, bendable and even rollable properties, good mechanical property, and so on. A flexible display device is generally manufactured on a flexible carrier. Its bendable property also brings great challenges to its design and manufacture. Indium-Tin-Oxide (ITO) electrode is generally used as an anode in the flexible display device to implement pixel display.

Figure 1:
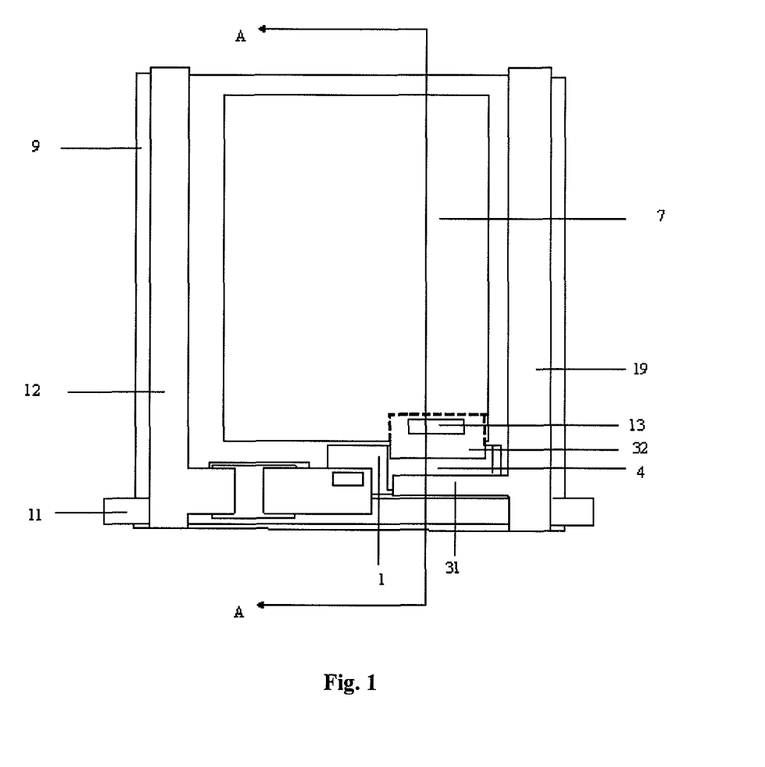
FIG. 1 is a plane view of a pixel unit of a display substrate in the prior art.
Figure 2:
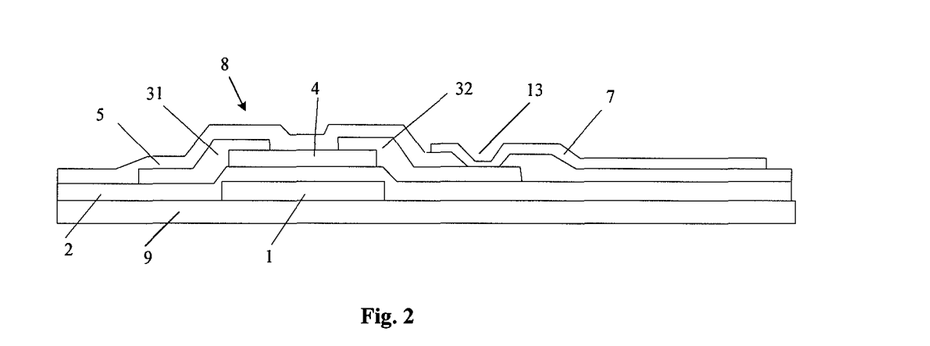
FIG. 2 is a cross-sectional view of the pixel unit of the display substrate in FIG. 1 taken along line A-A.

FIG. 1 is a plane view of a pixel unit of a display substrate in the prior art. FIG. 2 is a cross-sectional view of the pixel unit of the display substrate in FIG. 1 taken along line A-A. As shown in FIGS. 1 and 2, the display substrate comprises a base substrate 9, a thin film transistor 8 formed on the base substrate 9, and a pixel electrode 7 formed on the thin film transistor 8. The thin film transistor 8 comprises a gate electrode 1, a gate insulation layer 2, an active layer 4, a source electrode 31 and a drain electrode 32, which are sequentially arranged. A passivation layer 5 is formed on the source electrode 31 and the drain electrode 32, and the pixel electrode 7 is formed on the passivation layer 5. A via 13 is provided in the passivation layer 5. The pixel electrode 7 is electrically connected with the drain electrode 32 through the via 13, which allows the thin film transistor 8 to control the pixel electrode 7 to implement pixel display.

However, in the structure of the display substrate in the prior art, as shown in the plane view of FIG. 1, since the via 13 electrically connecting the drain electrode 32 with the pixel electrode 7 has a very small area, contact area between the drain electrode 32 and the pixel electrode 7 is very small. If the pixel electrode 7 is broken, the pixel electrode 7 and the drain electrode 32 will be disconnected, i.e., electrical connection therebetween cannot be maintained any longer. In this case, the pixel cannot be driven to display normally by an external signal, which reduces display quality.

SUMMARY OF THE INVENTION

The present invention provides a display substrate and a fabricating method thereof, a display panel, and a display device, which can increase the number of contact points and/or the size of contact area for the connection between the pixel electrode and the drain electrode, so that display quality is improved.

In order to achieve the above object, the present invention provides a display substrate, comprising a base substrate, gate lines and data lines formed on the base substrate, and at least one pixel unit defined by the gate lines and the date lines, each pixel unit comprising a thin film transistor and a pixel electrode, wherein, in each pixel unit, a drain electrode of the thin film transistor is electrically connected with the pixel electrode by at least part of an edge region of at least one side of the drain electrode.

Preferably, a passivation layer is formed over the drain electrode, a via for exposing the at least part of the edge region of the at least one side of the drain electrode is formed in the passivation layer, and the pixel electrode is electrically connected with the drain electrode through the via.

Preferably, the via has a ring shape when viewed in a direction vertical to a display plane of the display substrate.

Preferably, the via has a planar shape which is formed by a plurality of holes arranged in an array when viewed in a direction vertical to a display plane of the display substrate.

Preferably, the via has a ring shape formed by a plurality of holes arranged in an array, a continuous ring shape, or a partially-broken ring shape, when viewed in the direction vertical to the display plane of the display substrate.

Preferably, the drain electrode has a ring shape or a planar shape when viewed in a direction vertical to a display plane of the display substrate.

In order to achieve the above object, the present invention provides a display panel comprising the above display substrate.

In order to achieve the above object, the present invention provides a display device comprising the above display panel.

In order to achieve the above object, the present invention provides a fabricating method of a display substrate, comprising steps of forming, on a base substrate, gate lines, date lines and at least one pixel unit defined by the gate lines and the date lines, each pixel unit comprising a thin film transistor and a pixel electrode, wherein, in each pixel unit, the drain electrode is electrically connected with the pixel electrode by at least part of an edge region of at least one side of the drain electrode.

Preferably, the fabricating method further comprises steps of: forming a passivation layer over the drain electrode, and forming, in the passivation layer, a via for exposing the at least part of the edge region of the at least one side of the drain electrode, and the pixel electrode is electrically connected with the drain electrode through the via.

Preferably, the drain electrode has a ring shape or a planar shape when viewed in a direction vertical to a display plane of the display substrate.

In the display substrate and the fabricating method thereof, the display panel, and the display device of the present invention, by increasing the number of contact points and the size of contact area between the pixel electrode and the drain electrode, a part of the pixel electrode may still be electrically connected with the drain electrode even when a part of the pixel electrode is broken. Thus, reliability of the connection between the pixel electrode and the drain electrode is effectively enhanced, and display quality is improved.

DETAILED DESCRIPTION OF THE EMBODIMENTS

In order that a person skilled in the art can fully understand the technical solutions of the present invention, a display substrate and a fabricating method thereof, a display panel, and a display device of the present invention are further described below in detail in conjunction with the accompanying drawings. In the drawings, for ease of illustration, shapes, sizes, thicknesses and so on of respective components are schematic, and not exactly the same as those of actual components. In addition, some components are omitted for the sake of clarity.

Figure 3:
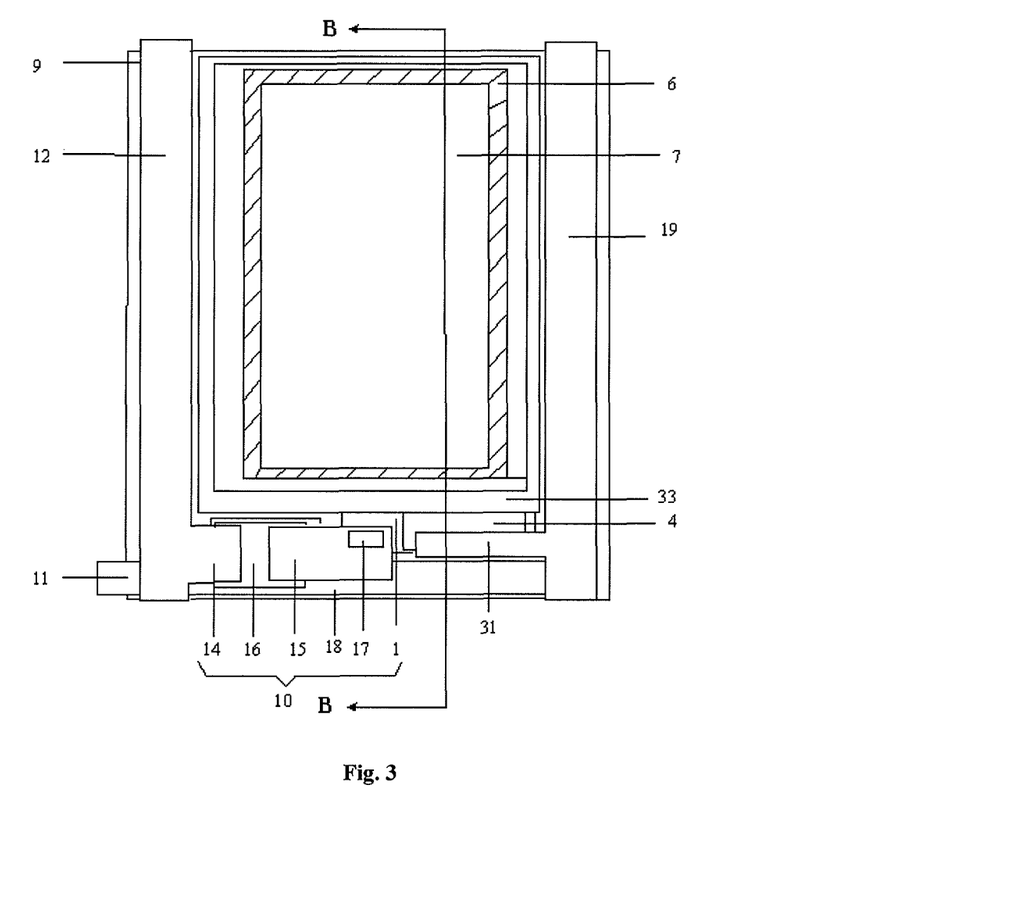
FIG. 3 is a plane view of a pixel unit of a display substrate in a first embodiment of the present invention.
Figure 4:
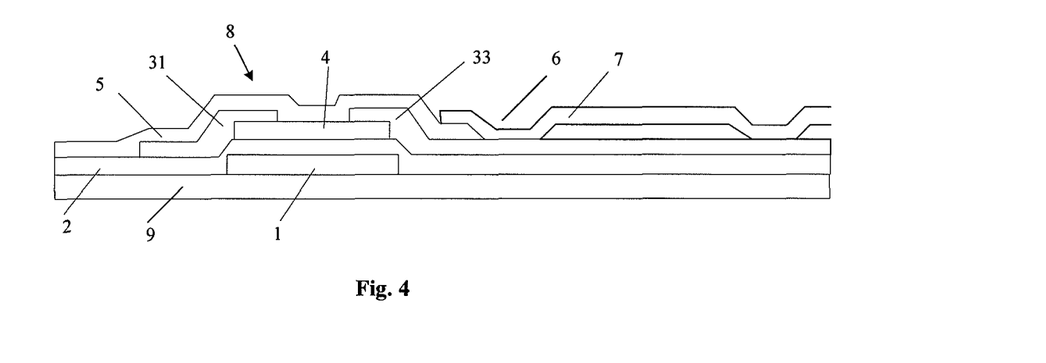
FIG. 4 is a cross-sectional view of the pixel unit of the display substrate in FIG. 3 taken alone line B-B.

FIG. 3 is a plane view of a pixel unit of a display substrate in a first embodiment of the present invention, and FIG. 4 is a cross-sectional view of the pixel unit of the display substrate in FIG. 3 taken alone line B-B. As shown in FIGS. 3 and 4, the display substrate comprises a base substrate 9, gate lines 11 and data lines 12 formed on the base substrate 9, and at least one pixel unit which is defined by the gate lines 11 and the data lines 12, each pixel unit comprises a thin film transistor 8 and a pixel electrode 7, and a drain electrode 33 of the thin film transistor 8 is electrically connected with the pixel electrode 7 by a via 6 arranged along an edge region of at least one side of the drain electrode 33.

Further, the display substrate comprises a power line 19 formed on the base substrate. The thin film transistor 8 comprises a gate electrode 1, a gate insulation layer 2 formed on the gate electrode 1, an active layer 4 formed on the gate insulation layer 2, and a source electrode 31 and the drain electrode 33 formed on the active layer 4. Optionally, an etch stopping layer (no shown in the drawings) may be provided between the active layer 4 and the source and drain electrodes 31 and 33. A passivation layer 5 is formed over the drain electrode 33, and the via 6 is provided in the passivation layer 5. A part of top surface of the drain electrode 33 is exposed by the via 6. For example, at least part of the edge region of at least one side of the drain electrode 33 is exposed so that the pixel electrode 7 can be electrically connected with the drain electrode 33 through the via 6. In addition, the display substrate may further comprise a thin film transistor 10. The thin film transistor 10 comprises a gate electrode 18, a gate insulation layer formed on the gate electrode 18, an active layer 16 formed on the gate insulation layer, and a source electrode 14 and a drain electrode 15 formed on the active layer 16, and the drain electrode 15 is connected with the gate electrode 1 of the thin film transistor 8 through a via 17.

Preferably, the via 6 has a substantial ring shape when viewed in a direction vertical to a display plane of the display substrate. For example, a projection of the via 6 on the plane view forms a ring with its trace along and near the edges of the drain electrode 33. The shape of the via 6 may be a ring formed by a plurality of holes arranged in an array (each of the holes exposes a part of the top surface of the drain electrode 33 so that the pixel electrode 7 can be electrically connected with the drain electrode 33 through each hole), a continuous ring, or a partially-broken ring. Further, the shape of the drain electrode 33 may be a ring or a plane. Since the via 6 in the present embodiment has a substantial ring shape, it significantly enlarges contact area between the pixel electrode 7 and the drain electrode 33, compared to the case that the pixel electrode is connected with the drain electrode through a single via having a hole shape in the prior art. Thus, reliability of connection between the pixel electrode 7 and the drain electrode 33 is enhanced, and thereby display quality of the display substrate is improved. In addition, when the via 6 is configured as a ring which is formed by a plurality of holes arranged in an array, the number of contact points between the pixel electrode 7 and the drain electrode 33 is also increased while the contact area is enlarged. Herein, although the shape of the via 6 is described as a continuous ring, a partially-broken ring or a ring formed by a plurality of holes arranged in an array, the shape of the via in the present embodiment is not limited thereto. Any shape of the via falls within the protective scope of the present invention as long as the shape can ensure that the pixel electrode 7 can still be electrically connected with the drain electrode 33 when the pixel electrode 7 is broken.

In the present embodiment, even if there are multiple broken portions in the pixel electrode 7, it is possible that there is still a part of the pixel electrode 7 which is electrically connected with the drain electrode 33 through the via 6. Thus, the pixel electrode 7 still can drive the pixel to display, and display quality is ensured. In the structure of the display substrate in the prior art, the pixel electrode is connected with the drain electrode through a single via with a hole shape, and thus the contact area therebetween is very small. When the pixel electrode is broken, the pixel electrode is likely to be disconnected from the drain electrode, resulting in that the pixel cannot be driven to display normally. Therefore, compared with the prior art, the display substrate of the present embodiment can effectively enhance the reliability of the connection between the pixel electrode and the drain electrode.

It should be noted that, in practical applications, area and distribution of the portions for connecting the pixel electrode and the drain electrode may be determined according to requirement for the aperture ratio and requirement for connectivity between the pixel electrode and the drain electrode.

In the display substrate of the present embodiment, the drain electrode and the pixel electrode are electrically connected with each other by a via arranged along the edge region of at least one side of the drain electrode, and thereby the number of the contact points and/or the size of the contact area between the drain electrode and the pixel electrode are increased. In a preferably embodiment, the drain electrode has a shape of a ring or a plane, and the via is designed to have a ring shape to enlarge area of the drain electrode exposed from the passivation layer accordingly. Thus, an area for electrical contact between the drain electrode and the pixel electrode is enlarged. In this way, even when a part of the pixel electrode is broken, it is possible that there is still a part of the pixel electrode which is connected with the drain electrode. Thus, reliability of the connection between the pixel electrode and the drain electrode is effectively enhanced, and the display quality is improved. Optionally, the via in the present embodiment may be designed to have a planar shape which is formed by a plurality of holes arranged in an array, and the drain electrode may be designed to have a planar shape.

Figure 5:
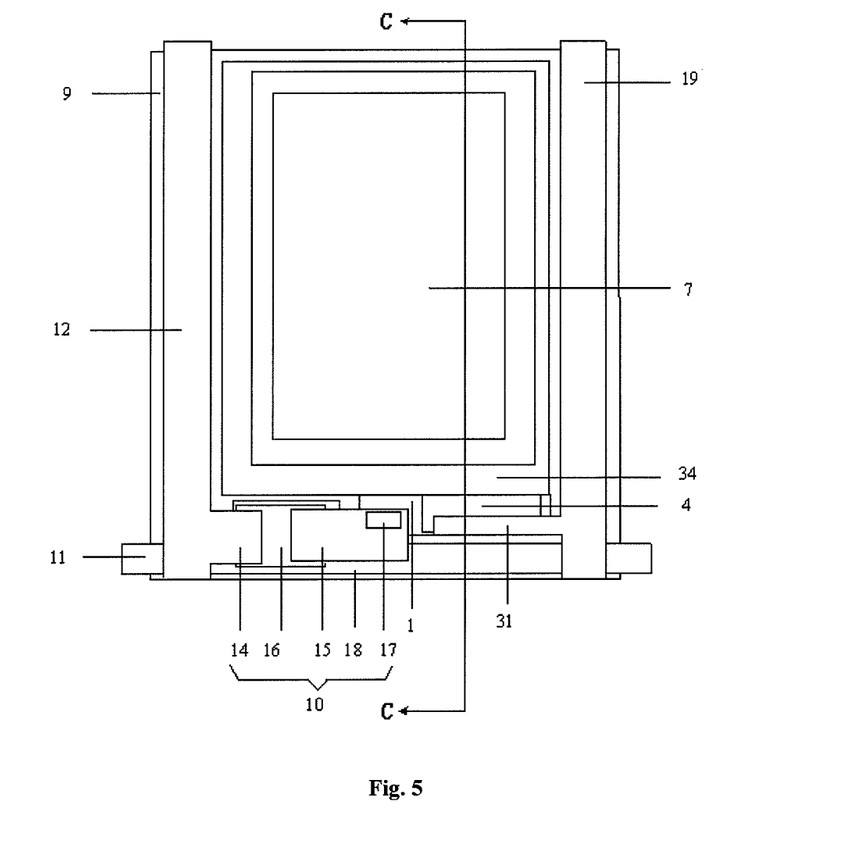
FIG. 5 is a plane view of a pixel unit of a display substrate in a second embodiment of the present invention.

FIG. 5 is a plane view of a pixel unit of a display substrate in a second embodiment of the present invention, and FIG.

Figure 6:
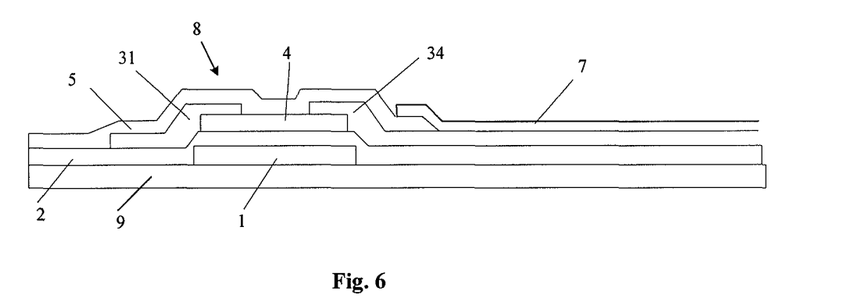
FIG. 6 is a cross-sectional view of the pixel unit of the display substrate in FIG. 5 taken alone line C-C.

6 is a cross-sectional view of the pixel unit of the display substrate in FIG. 5 taken alone line C-C. As shown in FIGS. 5 and 6, the display substrate comprises a base substrate 9, gate lines 11 and data lines 12 formed on the base substrate 9, and at least one pixel unit defined by the gate lines 11 and the data lines 12. Each pixel unit comprises a thin film transistor 8 and a pixel electrode 7, wherein a drain electrode 34 of the thin film electrode 8 and the pixel electrode 7 are electrically connected with each other through entire edge region of at least one side of the drain electrode 34. The drain electrode 34 and the pixel electrode 7 are arranged oppositely in a stacked manner.

The thin film transistor 8 comprises a gate electrode 1, a gate insulation layer 2 formed on the gate electrode 1, an active layer 4 formed on the gate insulation layer 2, and a source electrode 31 and a drain electrode 34 formed on the active layer 4. Optionally, an etch stopping layer (no shown in the drawings) may be provided between the active layer 4 and the source and drain electrodes 31 and 34. In addition, the display substrate may further comprise a thin film transistor 10. The thin film transistor 10 comprises a gate electrode 18, a gate insulation layer formed on the gate electrode 18, an active layer 16 formed on the gate insulation layer, and a source electrode 14 and a drain electrode 15 formed on the active layer 16, and the drain electrode 15 is connected with the gate electrode 1 of the thin film transistor 8 through a via 17.

Preferably, the drain electrode 34 has a planar shape, and the entire edge region of at least one side of the drain electrode 34 is exposed from a passivation layer. Thus, a portion of the drain electrode 34 exposed from the passivation layer has a planar shape. Since the pixel electrode 7 located over the drain electrode 34 is directly connected with the exposed portion of the drain electrode 34, a portion of the pixel electrode 7 connected with the drain electrode 34 has a planar shape, which enlarges the contact area of the pixel electrode 7 and the drain electrode 34, enhances the reliability of the connection between the pixel electrode 7 and the drain electrode 34, and improves the display quality of the display substrate. In practical applications, size of the area of the drain electrode 34 may be determined based on the size of the contact area between the pixel electrode 7 and the drain electrode 34. That is to say, by enlarging the area for electrical contact between the pixel electrode 7 and the drain electrode 34, the electrical connection between the pixel electrode 7 and the drain electrode 34 can still be maintained even when the pixel electrode 7 is broken.

In the present embodiment, since the portion for electrically connecting the drain electrode 34 and the pixel electrode 7 has a planar shape with a larger area, it is possible that a part of the pixel electrode 7 is still electrically connected with the drain electrode 34 even when there are multiple broken portions in the pixel electrode 7. Thus, the pixel electrode 7 can still drive the pixel to display, and the display quality is ensured. In the structure of the display substrate in the prior art, the pixel electrode is connected with the drain electrode through a single via with a hole shape, and thus the contact area is very small. When the pixel electrode is broken, the pixel electrode is likely to be disconnected from the drain electrode, resulting in that the pixel cannot be driven to display normally. Therefore, compared with the prior art, the display substrate of the present embodiment can effectively enhance the reliability of the connection between the pixel electrode and the drain electrode.

It should be noted that, in practical applications, a metal electrode layer may be laid as the drain electrode, and the pixel electrode electrically connected to the drain electrode may be used as an anode of an OLED.

It should be noted that, in the present embodiment, the thin film transistor, which is a driving thin film transistor for driving the OLED to display, may be an amorphous silicon thin film transistor (a-Si TFT), an oxide thin film transistor (Oxide TFT), or a low temperature polycrystalline silicon thin film transistor (LTPS TFT).

A third embodiment of the present invention provides a display panel in which the display substrate in the above first or second embodiment is used.

The display substrate in the display panel of the present embodiment comprises a base substrate, gate lines and data lines formed on the base substrate, and at least one pixel unit defined by the gate lines and the date lines. Each pixel unit comprises a thin film transistor and a pixel electrode. A drain electrode of the thin film transistor is electrically connected with the pixel electrode by at least part of an edge region of at least one side of the drain electrode. By increasing the number of contact points and/or the size of contact area between the pixel electrode and the drain electrode, it is possible that a portion of the pixel electrode which is not broken is still electrically connected with the drain electrode, even when another portion of the pixel electrode is broken. Thus, the reliability of the connection between the pixel electrode and the drain electrode is effectively enhanced, and thereby the display quality is improved.

Specific implementations of the display substrate of the present embodiment may be obtained by referring to the above first or second embodiment, and descriptions thereof are omitted here.

A fourth embodiment of the present invention provides a display device, in which the display substrate in the above first or second embodiment is used.

The display substrate in the display device of the present embodiment comprises a base substrate, gate lines and data lines formed on the base substrate, and at least one pixel unit defined by the gate lines and the date lines. Each pixel unit comprises a thin film transistor and a pixel electrode. A drain electrode of the thin film transistor is electrically connected with the pixel electrode by at least part of an edge region of at least one side of the drain electrode. By increasing the number of contact points and/or the size of contact area between the pixel electrode and the drain electrode, it is possible that a portion of the pixel electrode which is not broken is still electrically connected with the drain electrode, even when another portion of the pixel electrode is broken. Thus, the reliability of the connection between the pixel electrode and the drain electrode is effectively enhanced, and thereby the display quality is improved.

Specific implementations of the display substrate of the present embodiment may be obtained by referring to the above first or second embodiment, and descriptions thereof are omitted here.

Figure 7:
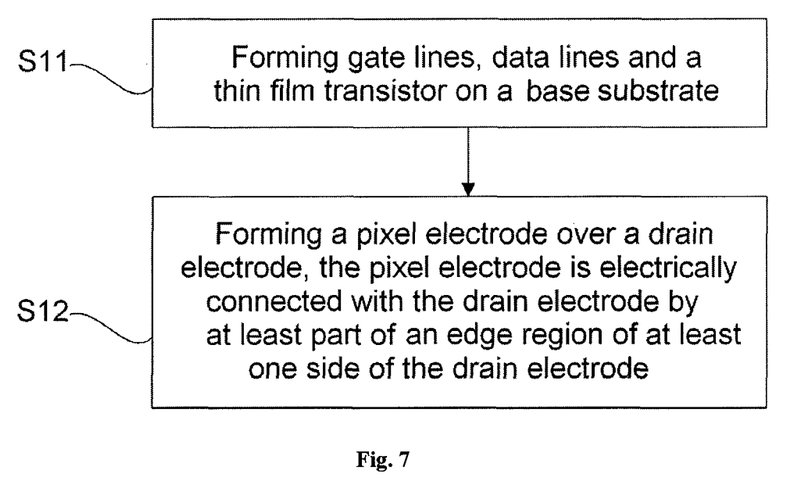
FIG. 7 is a flow chart of a fabricating method of a display substrate in a fifth embodiment of the present invention.

FIG. 7 is a flow chart of a fabricating method of a display substrate in a fifth embodiment of the present invention. As shown in FIG. 7, the fabricating method of a display substrate comprises the following steps.

Step S11: forming gate lines, data lines and thin film transistors on a base substrate.

Specifically, the gate lines, the data lines and the thin film transistors may be formed by a patterning process. The patterning process may at least comprise processes of photoresist application, exposure, developing, etching, photoresist stripping, and so on. The gate lines and the data lines define pixel units. Components of a thin film transistor, i.e., a gate electrode, a gate insulation layer formed on the gate electrode, an active layer formed on the gate insulation layer, a source electrode and a drain electrode formed on the active layer, and so on, may be formed by any known processes.

Step S12: forming a pixel electrode over the drain electrode, the pixel electrode being electrically connected with the drain electrode by at least part of an edge region of at least one side of the drain electrode.

Specifically, the pixel electrode may be formed by the patterning process. The patterning process may at least comprise processes of photoresist application, exposure, developing, etching, photoresist stripping, and so on. The pixel electrode and the thin film transistor constitute a pixel unit of the display substrate.

Preferably, the fabricating method of a display substrate may comprise the following step S13 between the step S11 and the step S12.

Step S13: forming a passivation layer over the drain electrode, and removing a part of the passivation layer to expose a part of the edge region of at least one side of the drain electrode.

Specifically, the passivation layer may be formed over the drain electrode by the patterning process, and a part of the passivation layer may be removed by a process such as etching, so as to form a via penetrating through the passivation layer to expose a part of top surface of the drain electrode. Preferably, the via may have a ring shape, for example, a ring shape formed by a plurality of holes arranged in an array, a continuous ring shape, or a partially-broken ring shape, so that a part of the edge region of at least one side of the drain electrode may be exposed. Preferably, the drain electrode may also have a ring shape.

After the passivation layer and the above via are formed, the pixel electrode may be formed over the passivation layer such that the pixel electrode contacts the exposed top surface of the drain electrode through the via, and thereby electrical connection with the drain electrode is formed.

In the present embodiment, a via is arranged along the edge region of at least one side of the drain electrode, which increases the number of contact points and/or the size of contact area between the drain electrode and the pixel electrode. Even when a portion of the pixel electrode is broken, it is possible that other portion of the pixel electrode which is not broken can still be electrically connected with the drain electrode. Thus, the reliability of the connection between the pixel electrode and the drain electrode is effectively enhanced, and the display quality is improved.

A sixth embodiment of the present invention provides another fabricating method of a display substrate, which may comprise the following steps:

a) forming gate lines, data lines and thin film transistors on a base substrate;

b) forming a pixel electrode over a drain electrode, the pixel electrode being electrically connected with the drain electrode by entire edge region of at least one side of the drain electrode.

Specifically, the gate lines, the data lines, the thin film transistors, and the pixel electrodes may be formed by a patterning process. The patterning process may at least comprise processes of photoresist application, exposure, developing, etching, photoresist stripping, and so on. The gate lines and the data lines define pixel units. Each pixel unit comprises a thin film transistor and a pixel electrode. The drain electrode of the thin film transistor and the pixel electrode are electrically connected with each other by exposing the entire edge region of at least one side of the drain electrode.

Preferably, the fabricating method of a display substrate may comprise the following step c) between the step a) and the step b).

c) forming a passivation layer covering a part of the drain electrode over the drain electrode such that the entire edge region of at least one side of the drain electrode is exposed.

After the passivation layer is formed, the pixel electrode may be formed over the passivation layer. The pixel electrode directly covers the top surface of a region of the drain electrode exposed from the passivation layer, and thereby is electrically connected to the drain electrode.

Preferably, the drain electrode is formed to have a planar shape so that the area of the edge region exposed by the via is larger. In practical applications, a layer of drain electrode may be laid under the pixel electrode by the patterning process to be connected with the pixel electrode.

By laying a layer of drain electrode under the pixel electrode to be connected with the pixel electrode, the contact area between the drain electrode and the pixel electrode may be enlarged. Even when a portion of the pixel electrode is broken, it is possible that a portion of the pixel electrode which is not broken is still connected with the drain electrode. Thus, the reliability of the connection between the pixel electrode and the drain electrode is effectively enhanced, and the display quality is improved.

It can be understood that the above embodiments are only exemplary embodiments for illustrating the principle of the present invention; however, the present invention is not limited thereto. For a person skilled in the art, various variations and improvements can be made without departing from the spirit and essence of the present invention, and these variations and improvements should be considered to be fallen within the protection scope of the present invention.

The invention claimed is:

1. A display substrate, comprising a base substrate, gate lines and data lines formed on the base substrate, and at least one pixel unit defined by the gate lines and the date lines, each pixel unit comprising a thin film transistor and a pixel electrode, wherein, in each pixel unit, a drain electrode of the thin film transistor is electrically connected with the pixel electrode by at least part of an edge region of at least one side of the drain electrode, wherein a passivation layer is formed over the drain electrode, a via for exposing the at least part of the edge region of the at least one side of the drain electrode is formed in the passivation layer, and the pixel electrode is electrically connected with the drain electrode through the via, and wherein the via has a ring shape when viewed in a direction vertical to a display plane of the display substrate, or has a planar shape which is formed by a plurality of holes arranged in an array, when viewed in a direction vertical to a display plane of the display substrate.

2. The display substrate of claim 1, wherein the via has a ring shape formed by a plurality of holes arranged in an array, a continuous ring shape, or a partially-broken ring shape, when viewed in the direction vertical to the display plane of the display substrate.

3. The display substrate of claim 2, wherein the drain electrode has a ring shape or a planar shape when viewed in a direction vertical to a display plane of the display substrate.

4. The display substrate of claim 1, wherein the drain electrode has a ring shape or a planar shape when viewed in a direction vertical to a display plane of the display substrate.

5. A display device, comprising the display substrate of claim 4.

6. A fabricating method of a display substrate, comprising steps of:
- forming, on a base substrate, gate lines, date lines and at least one pixel unit defined by the gate lines and the date lines, each pixel unit comprising a thin film transistor and a pixel electrode,
- wherein, in each pixel unit, a drain electrode of the thin film transistor is electrically connected with the pixel electrode by at least part of an edge region of at least one side of the drain electrode, and
- forming a passivation layer over the drain electrode, and forming, in the passivation layer, a via for exposing the at least part of the edge region of the at least one side of the drain electrode, wherein the pixel electrode is electrically connected with the drain electrode through the via,
- wherein the via has a ring shape when viewed in a direction vertical to a display plane of the display substrate, or has a planar shape which is formed by a plurality of holes arranged in an array, when viewed in a direction vertical to a display plane of the display substrate.

7. The fabricating method of a display substrate of claim 6, wherein the drain electrode has a ring shape or a planar shape when viewed in a direction vertical to a display plane of the display substrate.

* * * * *